(12) United States Patent
Izumi et al.

(10) Patent No.: US 9,285,691 B2
(45) Date of Patent: Mar. 15, 2016

(54) EXPOSURE APPARATUS AND METHOD FOR MANUFACTURING ARTICLE

(71) Applicant: CANON KABUSHIKI KAISHA, Tokyo (JP)

(72) Inventors: Nozomu Izumi, Utsunomiya (JP); Kouhei Nagano, Saitama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/670,490

(22) Filed: Mar. 27, 2015

(65) Prior Publication Data

US 2015/0286149 A1  Oct. 8, 2015

(30) Foreign Application Priority Data

Apr. 2, 2014  (JP) .................................. 2014-076448

(51) Int. Cl.
G03B 27/52 (2006.01)
G03B 27/54 (2006.01)
G03F 9/00 (2006.01)
G03F 7/20 (2006.01)

(52) U.S. Cl.
CPC .............. *G03F 9/70* (2013.01); *G03F 7/70141* (2013.01)

(58) Field of Classification Search
CPC .................................................. G03F 7/70141
USPC .................................. 355/53, 55, 67; 250/548
See application file for complete search history.

(56) References Cited

U.S. PATENT DOCUMENTS

| 5,138,176 | A | * | 8/1992 | Nishi | .................... G02B 6/4224 250/548 |
| 2009/0115985 | A1 | * | 5/2009 | Maeda | .................... G03B 27/52 355/55 |
| 2011/0033790 | A1 | * | 2/2011 | Mishima | ................ G03B 27/42 430/30 |

FOREIGN PATENT DOCUMENTS

JP  5006761 B2  8/2012

* cited by examiner

*Primary Examiner* — Hung Henry Nguyen
(74) *Attorney, Agent, or Firm* — Rossi, Kimms & McDowell LLP

(57) ABSTRACT

An exposure apparatus comprises a first detector detecting substrate-side marks via an original-side mark and a projection optical system; second detectors arranged in a larger number than the first detector and detecting the substrate-side marks not via the projection optical system; a reference plate having reference marks; and a control unit configured to obtain a first detection result of the plurality of reference marks by the second detectors, obtain first information relating to a first distance between the plurality of second detectors based on the first detection result, obtain a second detection result of the identical substrate-side mark by the first detector and the second detectors, obtain second information relating to a second distance between the first detector and the second detectors based on the second detection result, and control the alignment of the original and the substrate based on the first information and the second information.

11 Claims, 3 Drawing Sheets

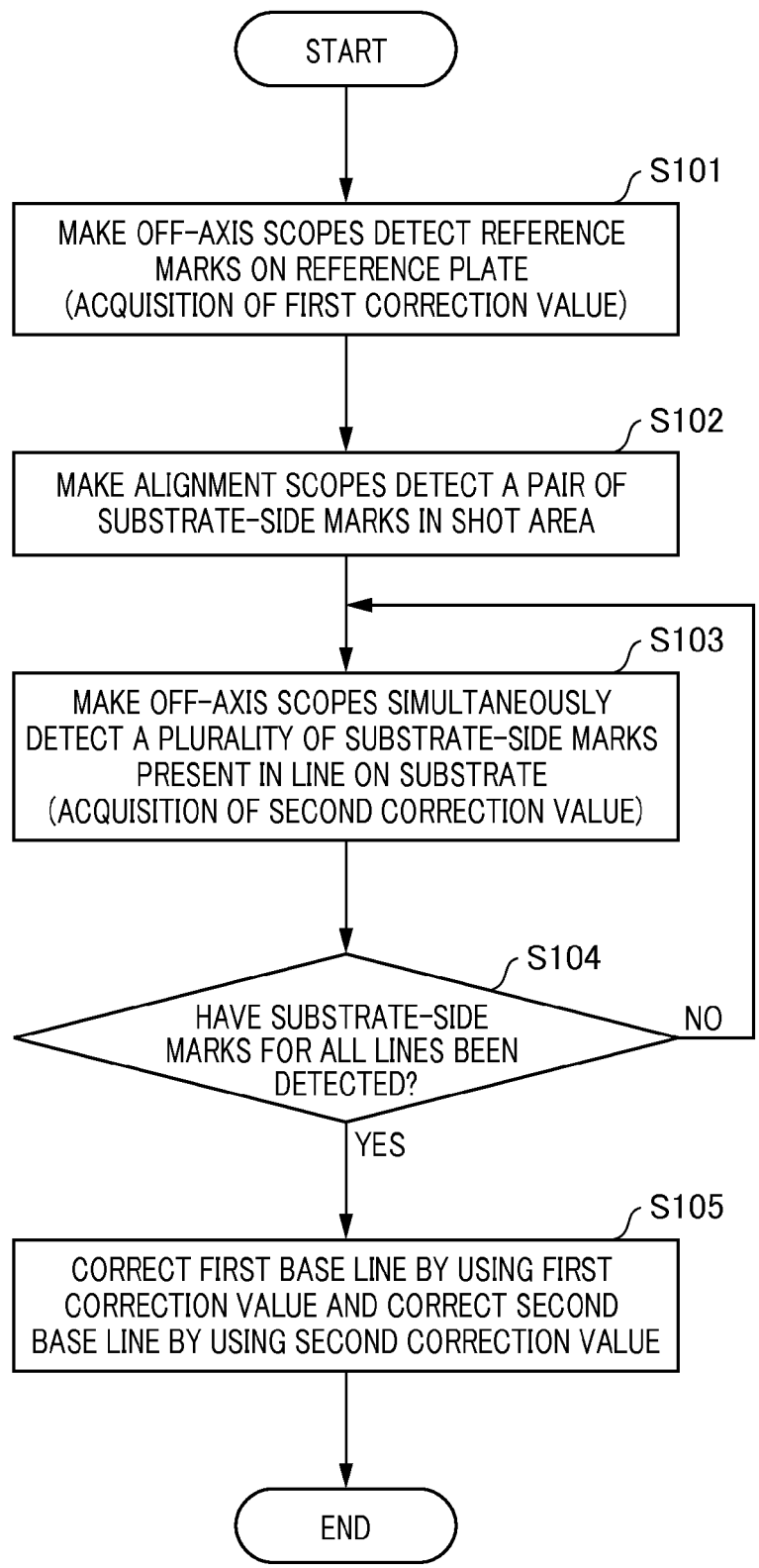

EXPOSURE APPARATUS AND METHOD FOR MANUFACTURING ARTICLE

BACKGROUND OF THE INVENTION

1. Field of the Invention

The present invention relates to an exposure apparatus and a method for manufacturing an article.

2. Description of the Related Art

An exposure apparatus that transfers a pattern of an original such as a mask onto a substrate such as a glass plate and a wafer to which a resist is applied has been used for manufacturing a flat panel, for example, a liquid crystal panel and an organic EL panel, and a semiconductor device. In such exposure apparatus, positioning the pattern of the original in a shot area on the substrate with high accuracy is important. At the same time, improving throughput (productivity) is also expected to the exposure apparatus.

As a method for improving throughput, for example, there is a method in which only a portion of the marks (alignment marks) have been measured (reduce the number of the marks to be measured), not measuring all of the marks on the substrate, in the alignment (positioning) of the original and substrate. Japanese Patent No. 5006761 discloses a method in which only a portion of the marks in the shot area are measured and a correction amount in the shot area is predicted based on a shot area in another substrate for which all of the marks have been measured.

However, there is a high probability that the method disclosed in Japanese Patent No. 5006761 will cause an error in the correction amount of the shot area due to the reduced number of the marks to be measured in a case where the substrate is randomly deformed.

SUMMARY OF THE INVENTION

The present invention provides, for example, an exposure apparatus advantageous in terms of improving alignment accuracy and throughput.

According to an aspect of the present invention, an exposure apparatus for transferring an image of a pattern formed on an original onto a substrate via a projection optical system is provided, the exposure apparatus comprising: a first detector that detects at least one of substrate-side marks formed on the substrate via an original-side mark formed on the original and the projection optical system; a plurality of second detectors that are arranged in a larger number than the first detector, and respectively detect the substrate-side marks not via the projection optical system; a reference plate that has a plurality of reference marks; and a control unit configured to control alignment of the original and the substrate, wherein the control unit is configured to obtain a first detection result of the plurality of reference marks by the second detectors and to obtain first information relating to a first distance between the plurality of second detectors based on the first detection result, the control unit is configured to obtain a second detection result of the identical substrate-side mark by the first detector and the second detectors and to obtain second information relating to a second distance between the first detector and the second detectors based on the second detection result, and the control unit is configured to control the alignment of the original and the substrate based on the first information and the second information.

Further features of the present invention will become apparent from the following description of exemplary embodiments (with reference to the attached drawings).

BRIEF DESCRIPTION OF THE DRAWINGS

FIG. 3 is a flowchart illustrating a flow of alignment in one embodiment.

DESCRIPTION OF THE EMBODIMENTS

Hereinafter, preferred embodiments of the present invention will be described with reference to the drawings.

Figure 1:
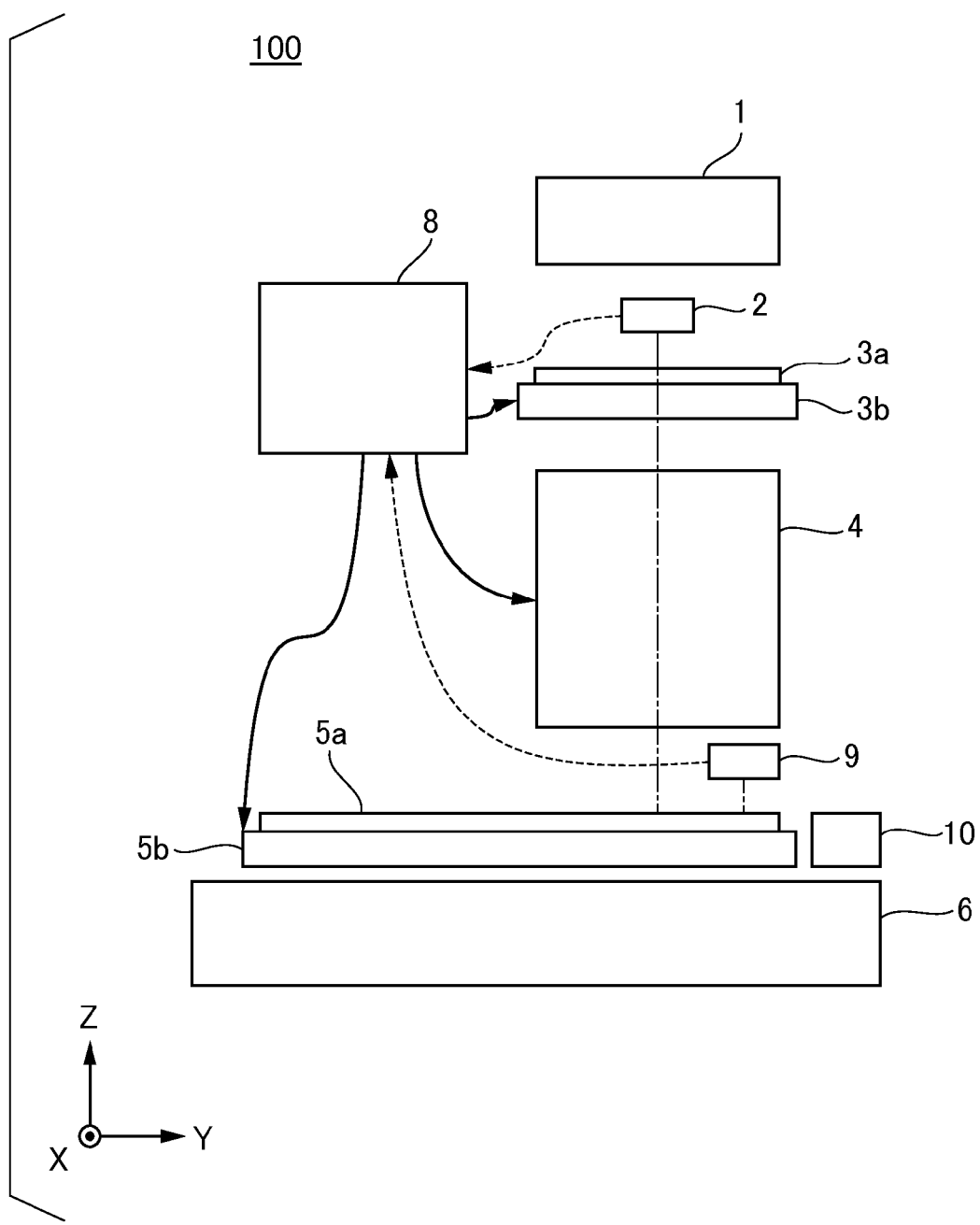
FIG. 1 illustrates a configuration of an exposure apparatus according to one embodiment of the present invention.

Firstly, a description will be given of a configuration of an exposure apparatus according to one embodiment of the present invention. FIG. 1 is a schematic diagram illustrating a configuration of an exposure apparatus 100 according to the present embodiment. The exposure apparatus 100 is used as a lithography apparatus in, for example, a manufacturing process of a flat panel such as a liquid crystal display device and an organic EL device,. In particular, in the present embodiment, the exposure apparatus 100 is a scanning type projection exposure apparatus that transfers (exposes) a pattern formed on an original (mask) 3a onto a substrate 5a that is, for example, a glass plate by a step-and-scan method. The exposure apparatus 100 comprises an illumination optical system 1, an original stage 3b, a projection optical system 4, a substrate stage 5b, an alignment measuring unit 2, an off-axis measuring unit 9, a reference plate 10, and a control unit 8. Note that, in FIG. 1 and FIGS. 2A to 2E below, the Y-axis is positioned in a scanning direction of the original 3a and the substrate 5a during the exposure in a plane perpendicular to the Z-axis that is in a vertical direction, and the X-axis is positioned in a non-scanning direction that is orthogonal to the Y-axis.

The illumination optical system 1 has a light source (not illustrated) and irradiates slit-shaped illumination light (for example, a circular arc shape) to the original 3a. The original stage 3b holds the original 3a and is movable in a Y-axis direction. The projection optical system 4 employs a mirror projection method configured by a plurality of mirrors, and projects an image of a pattern formed on the original 3a onto the substrate 5a held by a substrate stage 5b, for example, at equal magnification. The substrate stage (substrate holding unit) 5b is placed on a base 6, holds the substrate 5a and is movable, for example, in six directions, specifically, the X, Y, Z, ωx, ωy, and ωz directions. During the exposure, the original 3a held by the original stage 3b and the substrate 5a held by the substrate stage 5b are arranged in a conjugate-positional relation (an object surface and an image surface of the projection optical system 4) via the projection optical system 4.

The alignment measuring unit 2 is placed between the illumination optical system 1 and the original 3a, and includes at least two alignment scopes 2a and 2b (see FIG. 2C) that serve as first detectors. The exposure apparatus 100 performs alignment (positioning) between the shot area (substrate 5a) and the original 3a when transferring the pattern of the original 3a onto a plurality of the shot areas on the substrate 5a. Then the alignment measuring unit 2 simultaneously detects (observes) marks (substrate-side marks) formed on the substrate 5a and a plurality of marks (original-side marks) formed on the original 3a via the projection optical system 4. Note that the substrate 5a may be exposed (a resist on the substrate 5a may be exposed) if light having a same wavelength as a wavelength of light used upon exposing the substrate 5a is used when performing measurement by the alignment measuring unit 2. Accordingly, light having a wavelength that differs from the wavelength of the light used upon exposing the substrate 5a, which is non-exposure light, is used for the light used when performing alignment measurement.

The off-axis measuring unit 9 is located between the projection optical system 4 and the substrate 5a (substrate stage 5b), and includes at least two (six in the present embodiment) off-axis scopes 9a to 9f (see FIG. 2D) that serve as second detectors. The off-axis measuring unit 9 detects (observes) a plurality of marks provided in the shot area on the substrate 5a not via the projection optical system 4. Note that light used upon performing measurement by the off-axis measuring unit 9 is also light having the wavelength that differs from the wavelength of the light used upon exposing the substrate 5a (non-exposure light), in a manner similar to the measurement by the alignment measuring unit 2.

The reference plate 10 is located at a position where the off-axis measuring unit 9 is detectable, for example, at a position facing the off-axis measuring unit 9, and includes a plurality of reference marks 10a to 10f corresponding to each position (location) of the off-axis scopes 9a to 9f. That is, each of the off-axis scopes 9a to 9f of the off-axis measuring unit 9 can individually detect each of the reference marks 10a to 10f that are provided to corresponding positions. Additionally, the exposure apparatus 100 may include a driving unit (a first driving unit, not illustrated) that allows moving the reference plate 10 so that each of the reference marks 10a to 10f positions in the detection range when performing detection by using each of the off-axis scopes 9a to 9f. Alternatively, the exposure apparatus 100 may have a configuration in which the reference plate 10 is moved with the movement of the substrate stage 5b, for example, by integrally placing the reference plate 10 with the substrate stage 5b, without placing a driving unit that is exclusively used for moving the reference plate 10.

The control unit 8 is configured of, for example, a computer, connected to each component of the exposure apparatus 100 through lines, and can control the operation, the adjustment and the like of each component in accord with a program or the like. Note that the control unit 8 may be integrally configured with other parts of the exposure apparatus 100 (in a shared housing), or may be separately configured from other parts of the exposure apparatus 100 (in separate housings).

The control unit 8 acquires shape information of the shot area based on the position of each mark on the shot area measured by the alignment measuring unit 2 and the position of the mark on the shot area measured by the off-axis measuring unit 9. Among them, the shape information of the shot area includes, for example, a rotation component, a shift component, a magnification component, or an orthogonality component in the shot area. The shift component, the magnification component, and the orthogonality component can respectively include the X-direction component and the Y-direction component. Here, the control unit 8 makes the off-axis measuring unit 9 measure the reference plate 10, and thereby can acquire first information relating to a distance (a first distance, hereinafter referred to as "first base line") between the off-axis scopes 9a to 9f (between the second detectors) based on the measuring result. Additionally, the control unit 8 can acquire second information relating to a distance (second distance, hereinafter referred to as "second base line") between the alignment measuring unit 2 (alignment scope) and the off-axis measuring unit 9 (off-axis scope) in the scanning plane (XY plane). The control unit 8 can measure the position of each mark on the substrate 5a based on the first information and the second information. The control unit 8 determines a moving speed of the original stage 3b and the substrate stage 5b or a projection magnification of the projection optical system 4 based on the acquired shape information so that the marks on the original 3a and the marks on the shot area are overlapped. Subsequently, the control unit 8 scans the original stage 3b and the substrate stage 5b at a speed ratio in response to the projection magnification of the projection optical system 4 while synchronizing each other in the Y-axis direction. Hence, the pattern formed on the original 3a can be transferred onto the shot area on the substrate 5a. The exposure apparatus 100 performs an exposure process in one substrate 5a by sequentially repeating such scanning exposure to each of the shot areas on the substrate 5a while step-moving the substrate stage 5b.

Here, a description will be given of the alignment in the present embodiment while comparing this with the alignment in the conventional exposure apparatus. First, a description will be given of the marks respectively formed on the original 3a and the substrate 5a, and positional relationships of scopes and the like that included in each of the measuring units 2 and 9 for detecting them. FIGS. 2A to 2E are schematic plane diagrams for describing the respective positions of the marks respectively formed on the original 3a and the substrate 5a, each scope included in the alignment measuring unit 2 and the off-axis measuring unit 9, and the marks on the reference plate 10, and the correspondence relations between them.

Figure 2A:
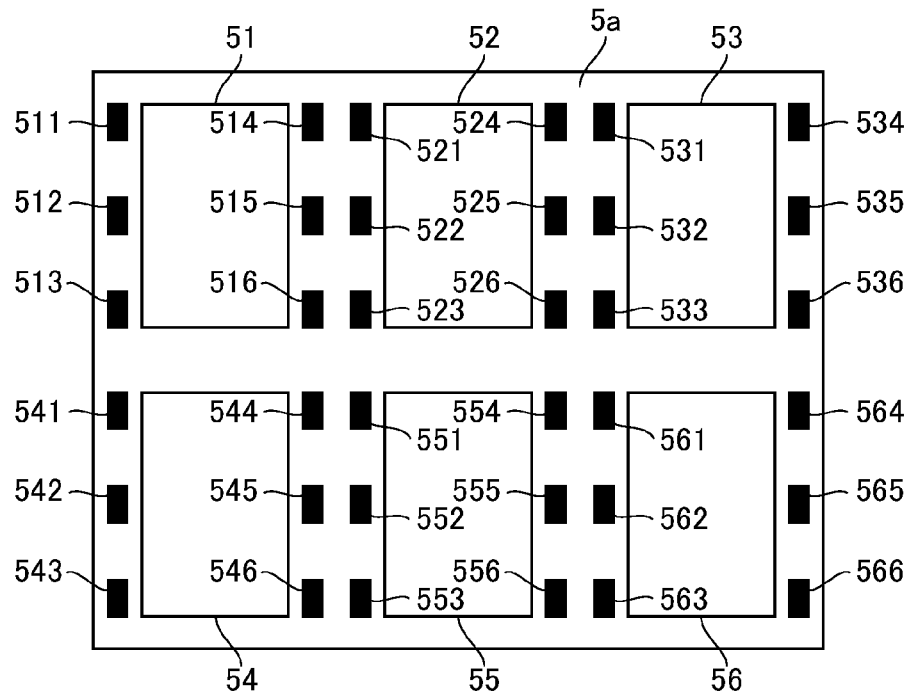
FIG. 2A illustrates an arrangement of marks on a substrate in one embodiment.

FIG. 2A is a diagram illustrating the position of the marks (alignment marks) formed on the substrate 5a. The substrate 5a includes a plurality of (in total, six areas having a 3×2 arrangement in the present embodiment) shot areas 51 to 56 on its surface. Additionally, a plurality of (in total, six marks having a 2×3 arrangement in the present embodiment) marks (for example, marks 511 to 516 are formed in the shot area 51) are formed around each of the shot areas 51 to 56.

Figure 2B:
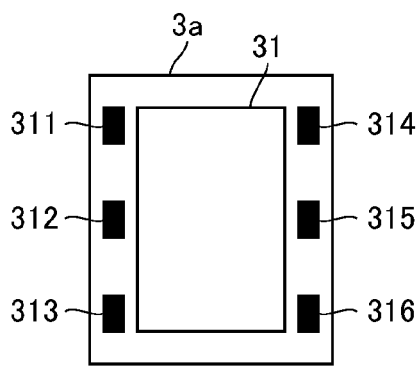
FIG. 2B illustrate an arrangement of marks on an original in one embodiment

FIG. 2B is a diagram illustrating the positions of the marks (alignment mark) formed on the original 3a. The original 3a includes an area 31, where a pattern to be transferred onto each of the shot areas 51 to 56 on the substrate 5a is formed. Subsequently, a plurality of (six in the present embodiment) marks 311 to 316 is formed around the area 31, for example, so as to respectively correspond to six marks arranged around each of the shot areas 51 to 56.

Figure 2C:
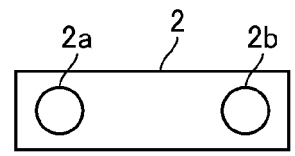
FIG. 2C illustrates an arrangement of alignment scopes in one embodiment.

FIG. 2C is a diagram illustrating the position of the alignment scopes of the alignment measuring unit 2. The alignment measuring unit 2 has, for example, two alignment scopes 2a and 2b that are arranged along the X-direction. Additionally, the example in FIG. 2C shows that the distance (interval) between the alignment scope 2a and the alignment scope 2b matches the interval in the X-direction of the substrate-side marks in one shot area (for example, the distance between the mark 511 and the mark 514).

Figure 2D:
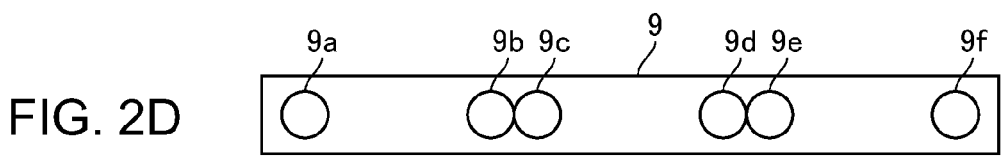
FIG. 2D illustrates an arrangement of off-axis scopes in one embodiment.

FIG. 2D is a diagram illustrating the positions of the off-axis scopes of the off-axis measuring unit 9. The off-axis measuring unit 9 has, for example, six off-axis scopes 9a to 9f that are arranged along the X-direction. In this way, the number of the placed off-axis scopes is larger than that of the placed alignment scopes of the alignment measuring unit 2. Hence, the off-axis measuring unit 9 (off-axis scopes 9a to 9f)

can simultaneously detect more substrate-side marks than those simultaneously detected by the alignment measuring unit 2 (alignment scopes 2a and 2b). Note that in the description below, "simultaneously" is interpreted in a broad sense of timing, which includes not only a completely identical timing, but also includes what is referred to as almost identical, which has an allowable time interval.

Figure 2E:
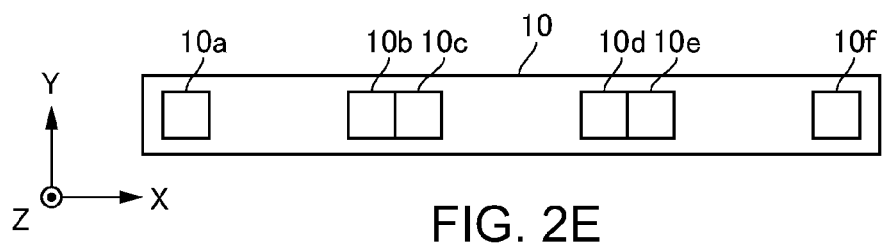
FIG. 2E illustrates an arrangement of reference marks in one embodiment.

FIG. 2E is a diagram illustrating the position of the reference marks formed on the reference plate 10. The reference marks 10a to 10f are arranged at positions where they are individually detectable at the off-axis scopes 9a to 9f, and preferably, at the positions where all of them are simultaneously detectable.

Firstly, a description will be given of the alignment in the conventional exposure apparatus, while the same components as those corresponding to the exposure apparatus 100 according to the present embodiment is designed by the same reference numerals The control unit 8 moves the substrate stage 5b and the original stage 3b, makes the alignment scope 2a detect the substrate-side mark 511 and the original-side mark 311, and makes the alignment scope 2b detect the substrate-side mark 514 and the original-side mark 314. That is, the alignment measuring unit 2 respectively simultaneously measures the position of the substrate-side mark 511 on the substrate 5a and the position of the substrate-side mark 514 on the substrate 5a. Next, the control unit 8 moves the substrate stage 5b and the original stage 3b, makes the alignment scope 2a detect the substrate-side mark 512 and original-side mark 312, and makes the alignment scope 2b detect the substrate-side mark 515 and the original-side mark 315. That is, the alignment measuring unit 2 respectively simultaneously measures the position of the substrate-side mark 512 on the substrate 5a and the position of the substrate-side mark 515 on the substrate 5a. Subsequently, the control unit 8 further moves the substrate stage 5b and the original stage 3b, makes the alignment scope 2a detect the substrate-side mark 513 and the original-side mark 313, and makes the alignment scope 2b detect the substrate-side mark 516 and the original-side mark 316. That is, the alignment measuring unit 2 respectively simultaneously measures the position of the substrate-side mark 513 on the substrate 5a and the position of the substrate-side mark 516 on the substrate 5a.

Hence, in the conventional exposure apparatus, the control unit 8 step-moves the substrate stage 5b and the original stage 3b, makes the alignment measuring unit 2 measure the position of all of the substrate-side marks arranged around the shot area 51 on the substrate 5a, and then acquires the shape information of the shot area 51. Other shot areas 52 to 56 are also similarly measured. The position of all of the substrate-side marks in each of the shot areas 51 to 56 on the substrate 5a are measured, and therefore the alignment of each of the shot areas 51 to 56 and the area 31 on the original 3a with high accuracy is allowed.

However, the alignment in the conventional exposure apparatus may cause decreasing throughput because the positions of all of the substrate-side marks in each of the shot areas 51 to 56 is detected by using only the alignment measuring unit 2. In contrast, there is a method in which only a portion of the marks are measured and a correction amount in the shot area is predicted based on a shot area of another substrate where all of the substrate-side marks have been measured, to improve throughput with maintaining alignment accuracy. However, the substrate becomes thinner accompanying the saving space in the flat panel in recent years, and the substrate may be randomly deformed during the manufacturing process of the flat panel when the substrate is made thinner. In this case, there is a high probability that the above method may cause an unallowable error in the correction amount of the shot area by the reduced number of the substrate-side marks to be measured. Accordingly, in the present embodiment, the alignment before exposure is carried out by using the alignment measuring unit 2 and the off-axis measuring unit 9, as shown below.

Next, a description will be given of the alignment in the exposure apparatus according to the present embodiment. FIG. 3 is a flowchart illustrating a flow of the alignment in the present embodiment. First, the control unit 8 moves the substrate stage 5b and makes each of the off-axis scopes 9a to 9f of the off-axis measuring unit 9 simultaneously detect each of the reference marks 10a to 10f on the reference plate 10 (step S101). At this time, the off-axis measuring unit 9 measures the position of the off-axis scopes 9a to 9f corresponding to the reference marks 10a to 10f. The control unit 8 acquires the first information based on the measuring result (first detection result), and uses it as a correction value (first correction value) for correcting the first base line.

Next, the control unit 8 moves the substrate stage 5b and the original stage 3b, and makes each of the alignment scopes 2a and 2b detect a pair of (two) the substrate-side marks lined along the X-axis direction in the one shot area, among the substrate-side marks (step S102). For example, the control unit 8 selects a pair of two substrate-side marks 521 and 524 that are present in a first line in the shot area 52. Subsequently, the control unit 8 makes the alignment scope 2a detect the substrate-side mark 521 and the original-side mark 311, and makes the alignment scope 2b detect the substrate-side mark 524 and the original-side mark 314. That is, the alignment measuring unit 2 respectively simultaneously measures the position of the substrate-side mark 521 on the substrate 5a and the position of the substrate-side mark 524 on the substrate 5a.

Next, the control unit 8 moves the substrate stage 5b and makes each of the off-axis scopes 9a to 9f respectively simultaneously detect the six substrate-side marks 511, 514, 521, 524, 531, and 534 that are present in the first line on the substrate 5a (step S103). That is, the off-axis measuring unit 9 measures the position of each of the substrate-side marks 511, 514, 521, 524, 531, and 534. Additionally, the control unit 8 acquires the difference (the second information) between the measuring result of the substrate-side marks 521 and 524 acquired in step S102 and the measuring result of the substrate-side marks 521 and 524 acquired in step S103. Note that these measuring results are referred to as a second detection result. Then, the control unit 8 uses the difference as a correction value (second correction value) for correcting the second base line.

Next, the control unit 8 determines whether or not all the lines of the substrate-side marks on the substrate 5a are detected (step S104). Here, when the control unit 8 determines that the detection has not finished for all of the lines (NO), the process returns to step S103, and the control unit 8 makes each of the off-axis scopes 9a to 9f detect the substrate-side marks that are present in the subsequent line (for example, second line if the process forwards in the above flow). Specifically, the control unit 8 moves the substrate stage 5b and makes each of the off-axis scopes 9a to 9f respectively simultaneously detect each of the substrate-side marks 512, 515, 522, 525, 532, and 535 that are present in the second line on the substrate 5a. That is, the off-axis measuring unit 9 measures the position of each of the substrate-side marks 512, 515, 522, 525, 532, and 535. The control unit 8 repeats the measurements up to the measurements of the position of the substrate-side marks 543, 546, 553, 556, 563, and 566 that are present in a final line (the sixth line), and when the control unit 8 determines the detection for all of the lines has been finished in step S104 (YES), the process is forwarded to step S105.

Subsequently, the control unit 8 corrects the first base line (as a reference) by using the first correction value acquired in step S101, as necessary, and corrects the second base line (as a reference) by using the second correction value acquired in step S103 (step S105). Here, "as necessary" corresponds to a case, for example, where the error of the respective base lines exceeds the allowable range that is previously regulated. Then, the control unit 8 specifies the position of each of the substrate-side marks on the substrate 5*a* by using the corrected first base line or the corrected second base line, and performs alignment of the original 3*a* and the substrate 5*a* based on the position.

Hence, the alignment in the exposure apparatus 100 allows reducing the error of the measuring position between each of the substrate-side marks and acquiring the shape information of each of the shot areas 51 to 56 with high accuracy. Particularly in the present embodiment, the correction is performed not only for the second base line that is a distance between the alignment measuring unit 2 and the off-axis measuring unit 9 in the scanning plane, but also for the first base line that is a distance between the plurality of off-axis scopes 9*a* to 9*f*, so that the efficiency is remarkable. Moreover, the alignment in the exposure apparatus 100 allows measuring the position of all of the marks on the substrate 5*a* in fewer processes than the alignment in the conventional exposure apparatus, and therefore it is advantageous in improving throughput of the whole exposure apparatus 100.

As described above, according to the present embodiment, an exposure apparatus advantageous in terms of improving alignment accuracy and throughput is provided.

Note that six off-axis scopes included in the off-axis measuring unit 9 are employed in the present embodiment, but alternatively, for example, four or eight off-axis scopes may be employed. Additionally, using all of the off-axis scopes is not necessarily required, and, for example, when performing exposure to six shot areas in the exposure apparatus provided with eight off-axis scopes, only six off-axis scopes corresponding to them need to be used. Additionally, the number of the reference marks formed on the reference plate 10 is not necessarily identical to the number of the off-axis scopes. For example, when the position of the off-axis scope is variable, more reference marks than the off-axis scopes may be provided on the reference plate 10 in accordance with the presumed position of the off-axis scope.

Moreover, in the present embodiment, the measurement for the base line correction is performed on each of the substrates 5*a*, in other words, one measurement per one substrate 5*a* is performed, but the interval of the measurement is not limited to this, and the measuring frequency and the number of times may increase or decrease as necessary. Additionally, the measurement by using the alignment measuring unit 2 is not limited to once, but it may be possible to perform the measurement at a plurality of times or to perform the measurement of a plurality of marks as necessary.

Moreover, in the present embodiment, the substrate stage 5*b* is moved and the off-axis measuring unit 9 measures the reference plate 10 when performing alignment, but the substrate stage 5*b* is not necessarily moved at this time. For example, the reference plate 10 may be located beforehand so that the reference plate 10 moves to a position that is detectable by the off-axis measuring unit 9 when the substrate stage 5*b* moves to the position where the substrate 5*a* is exchanged. Accordingly, it is possible to carry out the measurement of the reference plate 10 by using the off-axis measuring unit 9 during exchanging the substrate 5*a*, to suppress an increase of cycle time due to the moving time of the substrate stage 5*b* for the measurement of the reference plate 10 and the measuring time, and to further improve throughput.

Moreover, in the present embodiment, the alignment measuring unit 2 measures the marks, and then the off-axis measuring unit 9 measures the identical mark to acquire the second correction value for correcting the second base line when performing alignment, but the order of the measurement is not limited to this. For example, the off-axis scopes 9*a* to 9*f* may measure the marks 511, 514, 521, 524, 531, and 534 simultaneously with the measurement of the marks 522 and 525 by using the alignment scopes 2*a* and 2*b*. Such simultaneous measurement allows further improvement of throughput. However, in this case, the distance between the alignment measuring unit 2 and the off-axis measuring unit 9 needs to be equal to the distance between the marks 522 and 525 and the marks 521 and 524.

Additionally, a driving unit (second driving unit) may be provided in the off-axis measuring unit 9 and a relative position to the projection optical system 4 may be variable. For example, providing the driving unit in the off-axis measuring unit 9 that is movable in the Y-direction allows adjusting the distance between the alignment measuring unit 2 and the off-axis measuring unit 9, that is, the second base line. Accordingly, the throughput can be further improved because the simultaneous measurement of the alignment measuring unit 2 and the off-axis measuring unit 9 is allowed after adjusting the distance if the shot layout or the mark position changes with reference to the Y-direction. Note that the second driving unit may be provided in the alignment measuring unit 2 rather than the off-axis measuring unit 9 in order to acquire a similar effect.

Moreover, for example, providing a driving unit (third driving unit) at each of the off-axis scopes 9*a* to 9*f*, which is movable in the X-direction, allows adjusting the distance between the off-axis scopes 9*a* to 9*f*, that is, the first base line. Accordingly, the throughput can be further improved if the shot layout or the mark location changes with reference to the X-direction. However, in this case, it is preferable to prepare beforehand the reference marks corresponding to the presumed position (interval) of the off-axis scopes 9*a* to 9*f*. This is because the measurement of the distance between the off-axis scopes 9*a* to 9*f* at each position becomes possible, and the correction of the first base line at each position becomes possible.

(Article Manufacturing Method)

A method of manufacturing an article according to the embodiment of the present invention is suitable for manufacturing an article such as a micro device (for example, a semiconductor device) or an element having a microstructure. The method of manufacturing an article according to the embodiment can include a step of forming a latent image pattern on a photosensitive agent applied to a substrate by using the above-described scanning exposure apparatus (a step of exposing a substrate), and a step of developing the substrate on which the latent image pattern is formed. Further, this manufacturing method includes other well-known steps (for example, oxidization, deposition, vapor deposition, doping, planarization, etching, resist removal, dicing, bonding, packaging and the like). The method of manufacturing an article according to the embodiment is superior to a conventional method in at least one of the performance, quality, productivity, and production cost of the article.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-076448 filed Apr. 2, 2014, which is hereby incorporated by reference herein in its entirety.

What is claimed is:

1. An exposure apparatus for transferring an image of a pattern formed on an original onto a substrate via a projection optical system, the exposure apparatus comprising:
a first detector that detects at least one of substrate-side marks formed on the substrate via an original-side mark formed on the original and the projection optical system;
a plurality of second detectors that are arranged in a larger number than the first detector and respectively detect the substrate-side marks not via the projection optical system;
a reference plate that has a plurality of reference marks; and
a control unit configured to control alignment of the original and the substrate,
wherein the control unit is configured to obtain a first detection result of the plurality of reference marks by the second detectors and to obtain first information relating to a first distance between the plurality of second detectors based on the first detection result,
wherein the control unit is configured to obtain a second detection result of the identical substrate-side mark by the first detector and the second detectors and to obtain second information relating to a second distance between the first detector and the second detectors based on the second detection result, and
wherein the control unit is configured to control the alignment of the original and the substrate based on the first information and the second information.

2. The exposure apparatus according to claim 1, wherein the first detector detects the substrate-side marks in accordance with timing for detecting by the second detectors.

3. The exposure apparatus according to claim 1, comprising a substrate holder that holds the substrate and is movable,
wherein the reference plate is disposed so as to move to a position that is detectable by the second detectors if the substrate holder is moved to a position where the substrate is exchanged.

4. The exposure apparatus according to claim 1, wherein the control unit is configured to correct the first distance if the plurality of second detectors detect the substrate-side marks, on the basis of the first information.

5. The exposure apparatus according to claim 1, wherein the control unit is configured to correct the second distance if the plurality of second detectors detect the substrate-side marks, on the basis of the second information.

6. The exposure apparatus according to claim 4, wherein the control unit is configured to specify the position of the substrate-side marks on the substrate by using the corrected first distance, and to perform the alignment of the original and the substrate based on the position.

7. The exposure apparatus according to claim 5, wherein the control unit is configured to specify the position of the substrate-side marks on the substrate by using the corrected second distance, and to perform the alignment of the original and the substrate based on the position.

8. The exposure apparatus according to claim 1, comprising a second driving unit that moves the first detector or the second detectors so that the distance between the first detector and the second detectors in a scanning direction of the substrate or the original during exposure is variable.

9. The exposure apparatus according to claim 1, comprising a third driving unit that varies the distance between the second detectors.

10. The exposure apparatus according to claim 1, wherein the first detector or the second detectors detect the substrate-side marks by using light having a wavelength that differs from a wavelength of light used during the exposure.

11. A method of manufacturing an article, the method comprising steps of:
exposing a substrate using an exposure apparatus for transferring an image of a pattern formed on an original onto the substrate via a projection optical system; and
developing the exposed substrate
wherein the exposure apparatus comprises:
a first detector that detects at least one of substrate-side marks formed on the substrate via an original-side mark formed on the original and the projection optical system;
a plurality of second detectors that are arranged in a larger number than the first detector and respectively detect the substrate-side marks not via the projection optical system;
a reference plate that has a plurality of reference marks; and
a control unit configured to control alignment of the original and the substrate,
wherein the control unit is configured to obtain a first detection result of the plurality of reference marks by the second detectors and to obtain first information relating to a first distance between the plurality of second detectors based on the first detection result,
wherein the control unit is configured to obtain a second detection result of the identical substrate-side mark by the first detector and the second detectors and to obtain second information relating to a second distance between the first detector and the second detectors based on the second detection result, and
wherein the control unit is configured to control the alignment of the original and the substrate based on the first information and the second information.

* * * * *